(12) United States Patent
Akiyama et al.

(10) Patent No.: US 6,250,251 B1
(45) Date of Patent: Jun. 26, 2001

(54) VACUUM PROCESSING APPARATUS AND VACUUM PROCESSING METHOD

(75) Inventors: Kazuyoshi Akiyama; Tatsuyuki Aoike; Toshiyasu Shirasuna, all of Nara; Hitoshi Murayama, Soraku-gun; Takashi Otsuka, Kyotanabe; Daisuke Tazawa, Nara-ken; Kazuto Hosoi, Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/282,462

(22) Filed: Mar. 31, 1999

(30) Foreign Application Priority Data

Mar. 31, 1998 (JP) .................................. 10-103833
Mar. 25, 1999 (JP) .................................. 11-082569

(51) Int. Cl.$^7$ ............................................. C23C 16/00
(52) U.S. Cl. ...................................... 118/723 E; 427/569
(58) Field of Search .................... 118/723 E, 723 R; 156/345; 427/569

(56) References Cited

U.S. PATENT DOCUMENTS 4,785,763 * 11/1988 Saitoh ........................ 118/723 MW
5,916,454 * 6/1999 Richardson et al. ............ 118/723 R

FOREIGN PATENT DOCUMENTS 60-186849   9/1995 (JP) .
9-219373    8/1997 (JP) .

OTHER PUBLICATIONS

Japanese Standards Association, "Surface Roughness—Definitions and Designations", 1994, JIS B 0601 (English version).

* cited by examiner

*Primary Examiner*—Thi Dang
(74) *Attorney, Agent, or Firm*—Fitzpatrick, Cella, Harper & Scinto (57) ABSTRACT

An object of the present invention is to provide a vacuum processing apparatus and a vacuum processing method capable of effectively preventing film peeling generated in a reaction vessel to provide a deposited film of excellent quality with reduced spherical projections. The present invention provides a vacuum processing apparatus or method utilizing a vessel, means for supplying a gas into the vessel and means for supplying an electric power and in which the gas is decomposed by the electric power to generate a discharge, wherein the surface of a member confronted with the discharge satisfies the conditions of (1) the ten-point mean roughness Rz with respect to a reference length of 2.5 mm according to the JIS standard being in a range of not smaller than 5 $\mu$m and not larger than 200 $\mu$m, and (2) the mean spacing S of adjacent local peaks according to the JIS standard being in a range of not smaller than 5 $\mu$m and not larger than 100 $\mu$m.

27 Claims, 6 Drawing Sheets

$$Rz = \frac{|Yp1+Yp2+Yp3+Yp4+Yp5|+|Yv1+Yv2+Yv3+Yp4+Yp5|}{5}$$

FIG. 5

$$S = \frac{1}{n} \sum_{i=1}^{n} Si$$

VACUUM PROCESSING APPARATUS AND VACUUM PROCESSING METHOD

BACKGROUND OF THE INVENTION

1. Field of the Invention

The present invention relates to a vacuum processing apparatus and a vacuum processing method. Particularly the present invention relates to a vacuum processing apparatus and a vacuum processing method capable of forming on a substrate a deposited film, specifically a functional deposited film, more specifically a deposited film of an amorphous semiconductor for use in a semiconductor device, an electrophotographic light-receiving member, an image input line sensor, an image pickup device or a photovoltaic device, by plasma CVD, further to a vacuum processing apparatus and a vacuum processing method capable of forming an amorphous silicon based electrophotographic photosensitive member by forming an amorphous silicon-based deposited film on a cylindrical substrate.

2. Related Background Art

In recent manufacture of semiconductor devices, there is frequently utilized so-called RF plasma CVD, which generally employs a high frequency of 13.56 MHz in consideration of the restriction by the radio law. Also there is proposed so-called microwave CVD utilizing microwave of a frequency of 2.45 GHz. The microwave CVD has advantages that are not achievable with the RF plasma CVD. More specifically, the microwave CVD can achieve a very large film deposition rate with an extremely high gas utilization efficiency. The microwave CVD utilizing microwave of 2.45 GHz is disclosed in Japanese Patent Application Laid-Open No. 60-186849.

In addition to such development in the method of decomposing a raw material gas, there has been developed a deposited film-forming apparatus for the purpose of stably supplying devices of high quality.

Particularly in the plasma CVD apparatus, during the formation of a deposited film on a substrate, the deposited film is also formed at the inside of the film forming apparatus, and such deposited film may be peeled off and scattered to significantly degrade the quality of the deposited film formed on the substrate. For this reason, there have been made various proposals for preventing such film peeling. For example, Japanese Patent Application Laid-Open No. 9-219373 (hereinafter referred to as "Reference 1") discloses an example of preventing the film peeling by varying the surface roughness (ten-point mean roughness Rz) of the high frequency power-introducing means from 5 $\mu$m to 200 $\mu$m.

Also in recent years, there is a strong demand for higher quality also for the amorphous silicon devices, because of the general improvement in the performance of the equipment utilizing the above amorphous silicon devices.

Particularly in the field of electrophotography, the aforementioned peeling of the deposited film formed inside the film forming apparatus causes collision of the peeled film to the surface of the electrophotographic substrate, thereby inducing abnormal growth, so-called "spherical projection" on the photosensitive member. Such spherical projection, after repeating image formation over a long period, may cause so-called white spots or black spots on a copied image.

In the field of electrophotography, therefore, there is required careful countermeasure against the film peeling, not only because the spherical projections directly result in an image defect to degrade an image quality, but also because a deposited film of a larger thickness and a larger area in comparison with that in other devices. Furthermore, the spherical projections of a conventionally acceptable level have now become a problem, since the recently strong demand for cost reduction and space saving for improving the office environment is accelerating the reduction of the diameter of the photosensitive member and the increase in the process speed.

For example, the spherical projections of a diameter smaller than 10 $\mu$m have scarcely induced problems but have recently been found out as the cause of image defect in the case of repeating the image formation for a long period under certain conditions.

It has also been found that the control of the average roughness Rz of a portion in contact with a glow discharge provides a slightly increased effect but scarcely provides a sufficient effect on such small spherical projections.

Because of the above-described facts, there is being requested a stronger measure for preventing the film peeling than the conventional one at the portion of the deposited film-forming apparatus being in contact with the glow discharge.

SUMMARY OF THE INVENTION

An object of the present invention is to provide a vacuum processing apparatus and a vacuum processing method capable of effectively preventing the film peeling generated in the reaction vessel during formation of a deposited film, thereby forming on a substrate a deposited film of excellent quality with reduced spherical projections, particularly a vacuum processing apparatus and a vacuum processing method capable of forming an amorphous silicon-based deposited film, and particularly amorphous silicon-based electrophotographic photosensitive member produced by the above apparatus and method, and a method therefore.

For attaining the above-mentioned object, the deposited film-forming apparatus and the deposited film-forming method of the present invention are characterized as follows.

The present invention provides a vacuum processing apparatus comprising: a vessel, an electric power-introducing means for generating discharge within the vessel, and a gas introducing means for supplying a gas into the vessel, wherein the surface of a member confronted with a discharge space has (1) the ten-point mean roughness Rz of not smaller than 5 $\mu$m and not larger than 200 $\mu$m, and (2) the mean spacing S of adjacent local peaks of not smaller than 5 $\mu$m and not larger than 100 $\mu$m.

Also, the present invention provides a vacuum processing method comprising the steps of: supplying a gas into a discharge space, supplying an electric power into an electric power-introducing means, and generating discharge in the discharge space confronted with a surface of a member having (1) the ten-point mean roughness Rz of not smaller than 5 $\mu$m and not larger than 200 $\mu$m, and (2) the mean spacing S of adjacent local peaks of not smaller than 5 $\mu$m and not larger than 100 $\mu$m.

According to the present invention, it is possible to effectively prevent the film peeling generated in the course of formation of a deposited film at a portion in contact with discharge, specifically at the inside of an apparatus for housing a substrate, thereby easily obtaining a deposited film with reduced spherical projections on the substrate.

DESCRIPTION OF THE PREFERRED EMBODIMENTS

The present invention accomplished by the present inventors is explained below in details.

In order to prevent generation of the peeling of the deposited film formed in the interior of the apparatus for housing a substrate (reaction vessel interior), the surface shape of a member constituting the reaction vessel interior is controlled in a desired shape, particularly Rz is controlled in a desired range to be able to obtain a slight effect of preventing film peeling, as described above. This is presumed to be based on a fact that a surface of the member is made rough to have a fine roughness thereon and increases a contact area of a member in contact with a deposited film, thereby increasing the contact frequency between the deposited film and the member surface to improve an adhesion therebetween and prevent the film peeling. For this reason, the adhesion with the film is considered to become larger as Rz increases. But a limitless increase in Rz is difficult to achieve in a surface treatment or working. It is important to conduct an additional development other than the Rz control in order to enhance the effect of preventing the film peeling.

The aforementioned Reference 1 discloses that the desired value of Rz is within a range of 5 to 200 $\mu$m.

However, even when the surface roughness of the member is controlled within the above-described range, it is necessary to conduct a further improvement in addition to the treatment of the member surface by controlling the Rz within the range as disclosed in Reference 1, in order to prevent formation of the spherical projections of a diameter smaller than 10 $\mu$m on the substrate. Specifically, the further development is to control the mean spacing of adjacent local peaks of a deposited film within a desired range.

Based on the description of Reference 1, at first the present inventors have conducted the following experiments in order to investigate the relationship between the surface roughness of the member constituting the interior of the reaction vessel and the spherical projections formed on the electrophotographic photosensitive member obtained.

EXPERIMENT 1

Figure 1A:
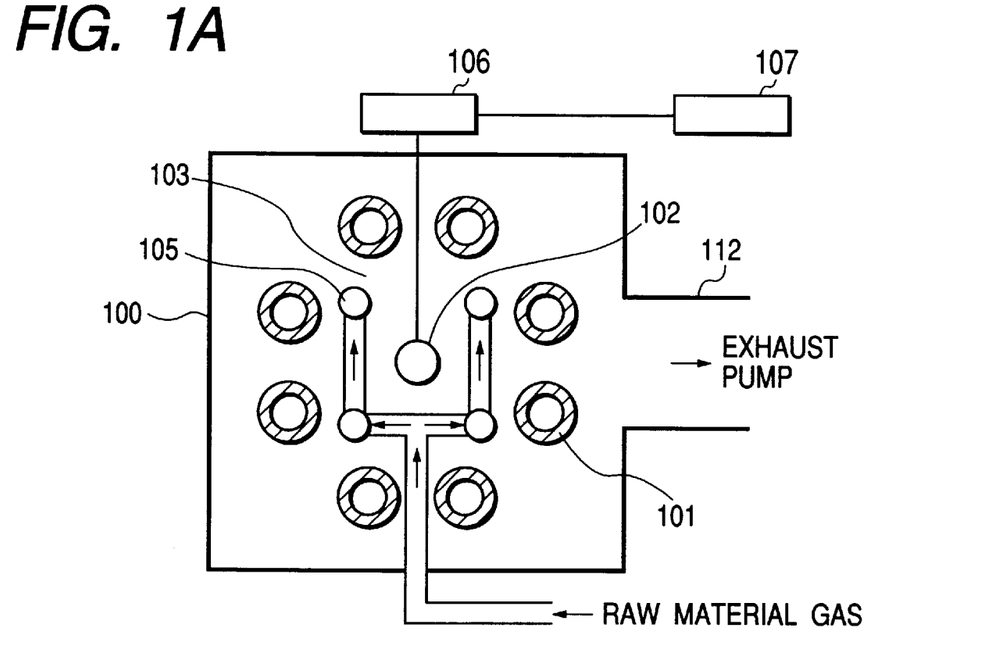
FIG. 1A is a schematically horizontal cross-sectional view showing a deposited film-forming apparatus of one embodiment of the present invention.
Figure 1B:
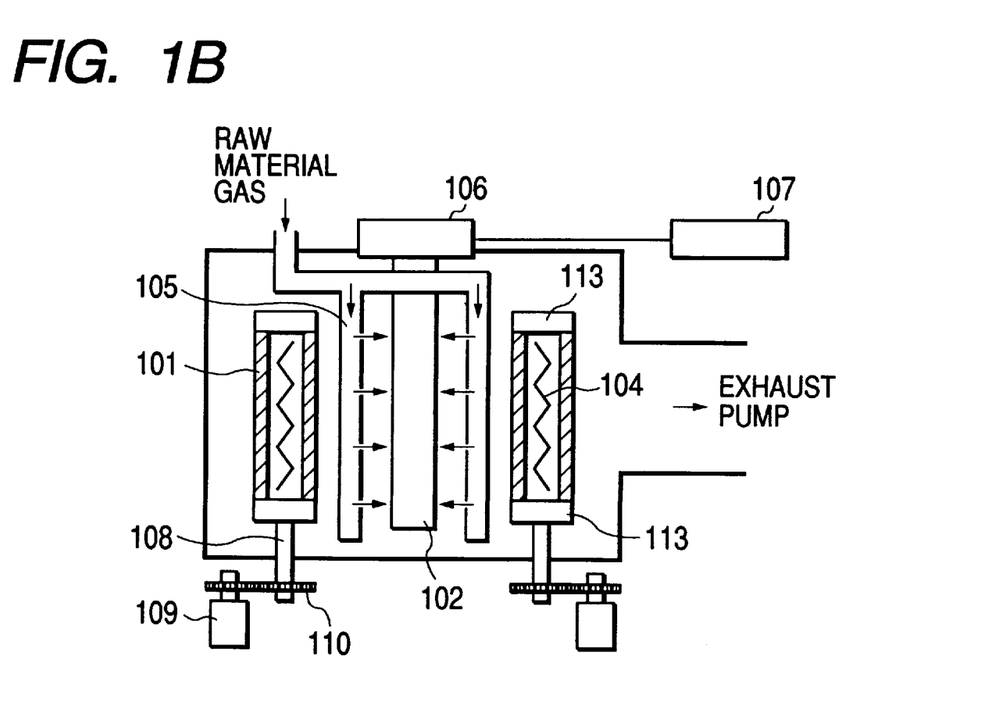
FIG. 1B is a schematically vertical cross-sectional view of the deposited film-forming apparatus shown in FIG. 1A.

FIGS. 1A and 1B show a deposited film-forming apparatus having the same structure as of the vacuum processing apparatus of the present invention. In Experiment 1, the deposited film-forming apparatus was utilized to produce an electrophotographic photosensitive member having the layer structure shown in FIG. 2 under the conditions shown in Table 1, wherein the ten-point mean roughness Rz with respect to a reference length of 2.5 mm of the high frequency power introducing means was varied within a range of 5 to 200 $\mu$m. The Rz was measured according to the Japanese Industrial Standard handbook (1994), that is, the JIS handbook B 0601.

The reference length is taken out from the measured roughness curve of the surface. Then, Rz is defined as the sum of an average of the absolute values of distances (Yp1 to Yp5) between the average line of the roughness curve taken out and the highest peak to the fifth peak from the highest one and an average of the absolute values of distances (Yv1 to Yv5) between the average line of the roughness curve taken out to the lowest valley to the fifth valley from the lowest one.

TABLE 1

| Layer structure | Charge injection inhibiting layer | Photo-conductive layer | Surface layer |
|---|---|---|---|
| Raw material gas and flow rate: | | | |
| SiH$_4$ (sccm) | 500 | 1000 | 120 |
| H$_2$ (sccm) | 500 | | |
| B$_2$H$_6$ (ppm) (with respect to SiH$_4$) | 1000 | 2 | |
| CH$_4$ (sccm) | | | 500 |
| Substrate temp. (° C.) | 250 | 250 | 250 |
| Internal pressure (Pa) | 6 | 4 | 4 |
| High frequency power (W) (105 MHz) | 5000 | 6000 | 3000 |
| Layer thickness ($\mu$m) | 3 | 30 | 0.5 |

In Table 1, the layer thickness is given in an approximate value.

FIG. 1A is a schematically horizontal cross-sectional view of a deposited film-forming apparatus for forming an electrophotographic photosensitive member as seen from the top direction, and FIG. 1B is a schematically vertical cross-sectional view of the apparatus shown in FIG. 1A as seen from the side direction. In this apparatus, a reaction vessel 100 is connected to an evacuating apparatus (not shown in the drawings) through an evacuation pipe 112. Plural substrates 101 (eight substrates in FIG. 1A) are positioned on a concentric circle around a high frequency power introducing means 102 between the means 102 and each substrate 101. A discharge space 103 is formed inside the circle. Within the discharge space 103, a raw material gas-introducing means 105 for introducing a raw material gas is provided and is connected to a raw material gas-supplying device (not shown in the drawing). The high frequency power-supplying means 102 is a discharge electrode, which is connected through a vacuum introducing mechanism such as an O ring (not shown in the drawings) to a matching box 106 outside the reaction vessel and is further connected to a high frequency power source 107, while maintaining the airtightness of the reaction vessel. Each substrate 101 is provided on a rotary shaft 108, and a heater 104 is provided in each substrate and can be used to heat the substrate 101 during film formation. The rotary shaft is provided through a vacuum bearing (not shown in the drawing) and is provided with a gear 110 outside the reaction vessel and further connected to a motor 109.

Figure 2:
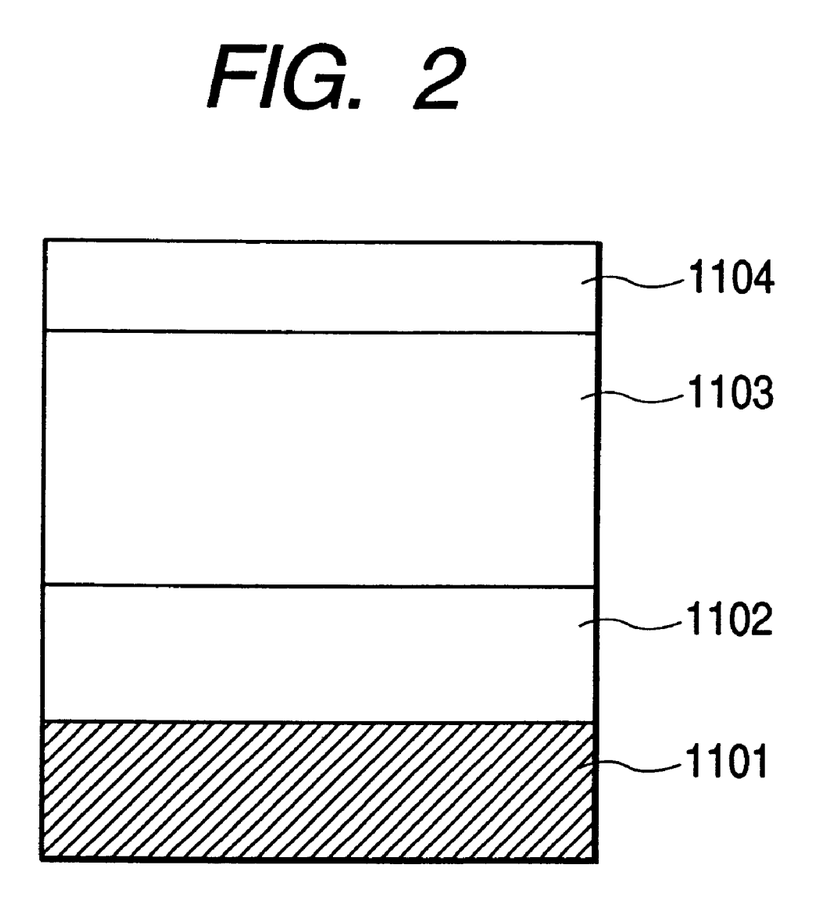
FIG. 2 is a cross-sectional view showing the layer structure of an electrophotographic photosensitive member.

The apparatus shown in FIGS. 1A and 1B is used to form a deposited film on the surface of a cylindrical substrate 101, and the layer structure of the deposited film formed on the substrate 101 is described below with reference to FIG. 2. FIG. 2 is a schematically cross-sectional view showing the layer structure of a deposited film formed on the substrate by using a deposited film-forming apparatus of the present embodiment. In this layer structure, a charge injection inhibiting layer 1102, a photoconductive layer 1103 and a surface layer 1104 are stacked successively on the substrate 1101. The manner of forming a photoconductive photosensitive member having this layer structure is approximately described below.

At first, the substrate 1101 previously degreased and rinsed is installed on the rotary shaft 108 in the reaction vessel, and then an evacuating apparatus is activated to evacuate the interior of the reaction vessel 100 to a pressure of 0.01 Pa or less. Then an inert gas such as argon is introduced from the raw material gas-supplying means 105 into the reaction vessel at a desired flow rate, and an evacuation valve (not shown in the drawings) provided on the evacuating pipe 112 is manipulated under the observation of a pressure gauge (not shown in the drawings) to adjust the pressure of the reaction vessel to a desired value, and the substrate 101 is heated by the heater 104 to a desired temperature within a range of 20° C. to 500° C. When the substrate 101 reaches a desired temperature, the introduction of the inert gas is interrupted and the interior of the reaction vessel is again evacuated to a pressure of 0.01 Pa or less.

Then a desired raw material gas (reactive gas) is introduced from the raw material gas-supplying means 105, and the evacuation valve (not shown in the drawings) provided on the evacuating pipe 112 is manipulated under the observation of the pressure gauge to adjust the pressure of the reaction vessel to a desired value. When the pressure is stabilized, the output of the high frequency power source 107 is set at a desired power, and the matching box 106 is adjusted to generate a glow discharge in the discharge space 103. Table 1 shows the setting values of the conditions such as the raw material gas flow rate, the substrate temperature, the internal pressure and the supplied power, and the obtained film thickness values. As the results, the raw material gas is decomposed to form a deposited film on the substrate 101. The substrate 101 is rotated by the motor 109 during formation of the deposited film, whereby the deposited film can be formed uniformly over the entire circumference of the substrate 101. When the charge injection inhibiting layer of a desired thickness is formed, the supply of the high frequency power and the raw material gas is stopped to terminate the glow discharge, and the interior of the reaction vessel 100 is again evacuated to a pressure of 0.01 Pa or less. The above-described procedure is similarly repeated according to the conditions shown in Table 1 after replacing the raw material gas with that for forming the photoconductive layer and that for forming the surface layer, whereby the photoconductive layer and the surface layer are successively formed to obtain a desired electrophotographic photosensitive member. In this experiment, the high frequency power-introducing means is composed of stainless steel (SUS304), a surface of which is made rough by blasting and it is possible to prevent the peeling of the deposited film attached to the high frequency power-introducing means.

The surface of each deposited film of the eight photosensitive members was observed under a microscope in order to investigate the change of the number of the spherical projections generated on the surface of the deposited film formed on the substrate by changing Rz of a portion in contact with the discharge. The number of the spherical projections per 10 cm$^2$ was investigated. This number was measured for all the simultaneously produced eight photosensitive members and the average of thus measured numbers was adopted.

Figure 3:
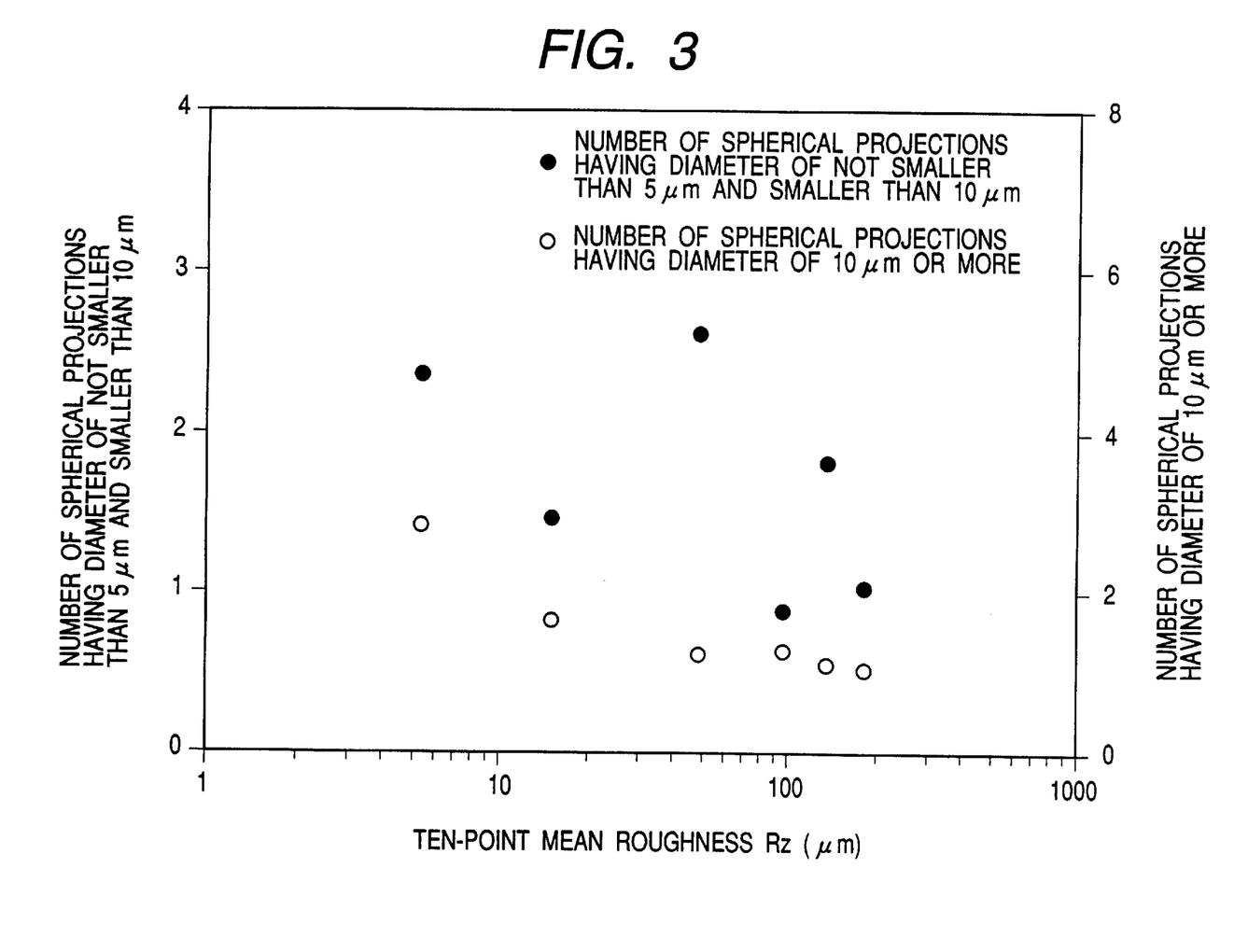
FIG. 3 is a graph showing the number of spherical projections generated in the case of forming a deposited by using a high frequency power-introducing means without control of the mean spacing S of adjacent local peaks.
Figure 8:
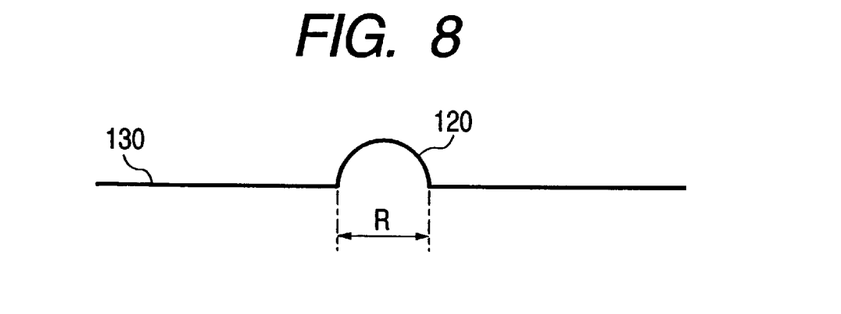
FIG. 8 is a view showing the diameter of a spherical projection in the present invention.

Results thus obtained are shown in FIG. 3. FIG. 3 is a graph showing the number of spherical projections having a diameter of not smaller than 5 μm and smaller than 10 μm and the number of spherical projections having a diameter of 10 μm or more with respect to the different ten-point mean roughnesses. FIG. 3 shows the relative values of the number of spherical projections with respect to different ten-point mean roughness values, when regarded as a standard the number of the spherical projections of a diameter of not smaller than 5 μm and smaller than 10 μm and the number of a diameter of 10 μm or more generated in the deposited film formed on the substrate, respectively, in the case of Rz of the surface of the high frequency power supplying means being 189.2 μm. The diameter of the spherical projection referred to in the present invention will be explained with reference to FIG. 8. FIG. 8 shows a spherical projection 120 generated on a deposited film 130. The surface of the deposited film 130 is substantially flat, the area where the spherical projection is present and the area where the spherical projection is absent can be easily distinguished by the observation under a microscope or the like. The diameter of the spherical projection is defined as a measured value of the maximum distance R between arbitrary two points on the boundary of the spherical projection with respect to the flat deposited film 130. For example, there is a case where a plurality of spherical projections are linked to form one substantial spherical projection. Referring to FIG. 3, the number of large spherical projections of 10 μm or more in diameter, i.e., having a large diameter decreased with the increase in Rz. It was found that generation of the large spherical projections could be prevented by increasing Rz, and the results are in the satisfactory range. The upper limit of the Rz value is preferably 200 μm. When Rz is 200 μm or less, it is possible to form a deposited film having the same surface roughness on the substrate with a high yield. On the other hand, the number of small spherical projections of 5 μm≦diameter<10 μm decreased as Rz decreased up to about 10 μm similarly to the case of the spherical projections of diameter ≧10 μm. But, when Rz exceeded 50 μm, the number of the spherical projections of 5 μm≦diameter<10 μm increased or decreased and can not be controlled while the number of the spherical projections of diameter ≧10 μm remained almost unchanged. It was thus found that the number of the small spherical projections of 5 μm<diameter<10 μm did not necessarily decrease by increasing the value of Rz.

Figure 4:
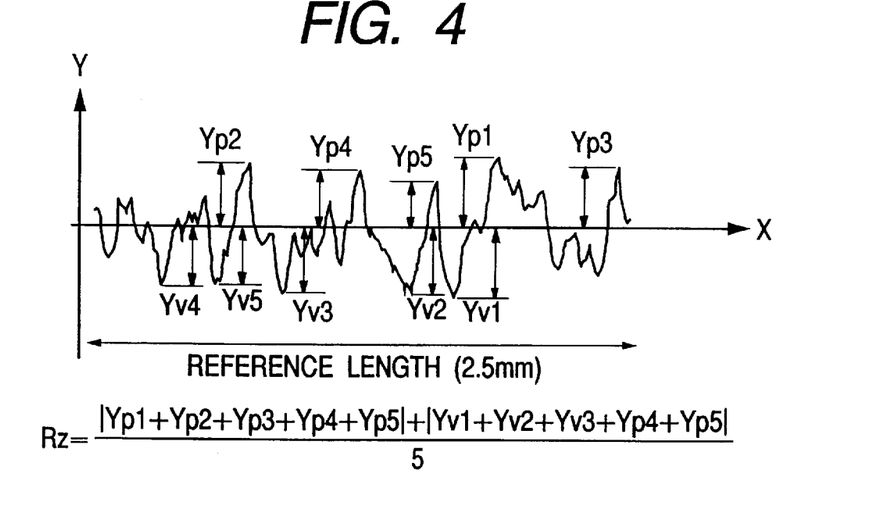
FIG. 4 is a diagram showing the definition of the ten-point mean roughness Rz.

FIG. 4 shows the formula for obtaining Rz used in the present embodiment and determined by the present inventors based on Rz according to the JIS B 0601 as described above. In the formula shown in FIG. 4, a reference length is taken out from the measured curve of surface roughness and Rz is defined as the sum of an average of the absolute values of distances (Yp1 to Yp5) between the average line of the roughness curve taken out and the highest peak to the fifth peak from the highest one and an average of the absolute values of distances (Yv1 to Yv5) between the average line of the roughness curve taken out and the lowest valley to the fifth valley from the lowest valley. This definition is convenient in intuitively obtaining the level of surface roughness in formation of a rough surface, but does not provided information on the peaks and valleys not contributed in the calculation of Rz value.

Therefore the present inventors have conducted experiments with the high frequency power-introducing means having various roughness curves and have found that the number of the small spherical projections in the range of 5 to 10 μm is controlled by the distance of roughness in addition to the surface irregularity (roughness).

Figure 5:
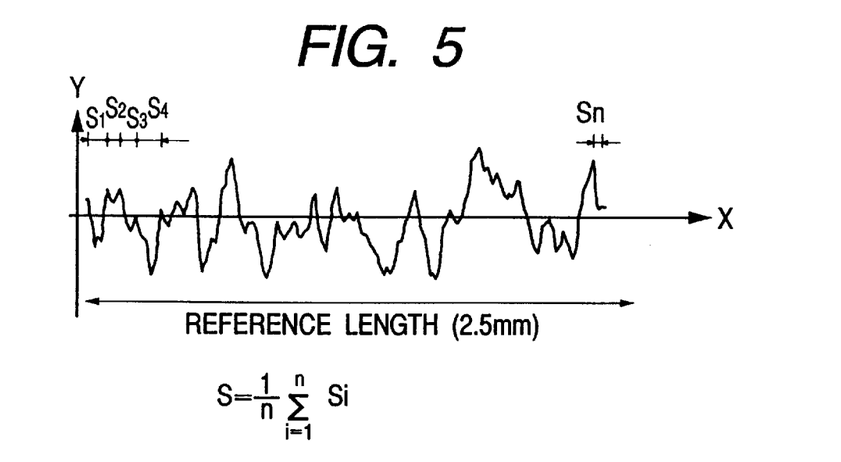
FIG. 5 is a diagram showing the definition of the mean spacing S of adjacent local peaks.

The above distance of the roughness is the distance between the adjacent peaks on the roughness curve. This distance is defined, according to the JIS handbook B 0601, as "mean spacing S of adjacent local peaks". This "S" is generally referred to as "pitch". The formula defining S is shown in FIG. 5. That is, a reference length is taken out from the roughness curve, and S is defined as the average value of the distance between adjacent local peaks on the roughness curve taken out.

In order to prevent the film peeling from the surface of the member, it is important to form a rough surface with a desired Rz value, thereby increasing the contact area between the member and the deposited film and improving the adhesion therebetween. As the result, this is effective in reducing the number of the spherical projections of a diameter of 10 μm or more on the deposited film formed on the substrate, as explained in the foregoing. However, even in the case of making a surface of the same material rough so as to have the same Rz value, the value S varies depending on the condition of forming such rough surface. The present inventors have obtained the following finding. Generation of spherical projections with a diameter of 10 μm or more can be prevented by further increasing the value Rz, and the value S of 5 μm or more on the surface between the adjacent peaks functions can prevent generation of the small spherical projections of 5 μm≦diameter<10 μm. When the value S becomes less than 5 μm, the rough surface having a height for preventing the film peeling can not be formed to increase small spherical projections. When the value S exceeds 100 μm, the small spherical projections of 5 μm≦diameter<10 μm tend to easily generate. Specifically, when the value S exceeds 100 μm, the smaller spherical projections is tend to remarkably increase.

The difference in the height of the surface is made larger to increase the surface area, and further the value S is made smaller, thereby becoming more effective in preventing the film peeling. Accordingly, it is possible to enhance the prevention of film peeling by defining the height of individual peaks (the distance of the mutually adjacent peak and valley is referred to as "H") in addition to the value S. The value H generally increases almost corresponding to the value S. Further, on a surface with the value S of not smaller than 5 μm and not larger than 100 μm, the value H becomes sufficiently large for preventing the formation of small spherical projections, whereby the value H tends to increase with the increase of the value S. Further, the control of the value S is easily conducted in comparison with the control of the value H in order to control the number of the smaller spherical projections. Therefore, the control of the value S in the desirable range is enough for controlling the surface treatment of the member, and the control of the value H is practically unnecessary.

For the purpose of preventing the generation of the spherical projections of 10 μm or more in diameter, the value Rz is preferably not smaller than a constant value. For example, when Rz is smaller than 5 μm, it becomes impossible to prevent film peeling that gives rise to the spherical projections with a diameter of 10 μm or more on the substrate. Under such condition of Rz, the value H becomes inevitably small, so that the spherical projections of diameter ≧10 μm are easily generated and the spherical projections of 5 μm≦diameter<10 μm also significantly increases because the small film peelings cannot be suppressed. According to the present invention, the value Rz of the member is controlled in a range of not smaller than 5 μm and not larger than 200 μm while the value S is controlled in a range of not smaller than 5 μm and not larger than 100 μm, thereby suppressing the formation not only of the spherical projections of 10 μm or more in diameter but also of those of not smaller than 5 μm and smaller than 10 μm in diameter.

Based on the above-described findings, it is rendered possible to effectively suppress the formation of the spherical projections of 5 μm or more in diameter by the surface of the member having:

(1) Rz within a range of 5 to 200 μm; and
(2) S within a range of 5 to 100 μm.

According to the JIS B 0601, the standard value of the reference length may be any one selected from 0.08 mm, 0.25 mm, 0.8 mm, 2.5 mm, 8 mm and 25 mm according to the magnitude of Rz or S, but in the present invention, measurement was conducted by using a reference length of 2.5 mm for calculating Rz and S. The values Rz and S are not particularly influenced by the magnitude of the reference length on a uniformly rough surface, so that the present invention is effective irrespective of the reference length.

The prevention of generation of spherical projections can be achieved by controlling within the above-defined surface roughness range at least a portion of the surface of a member in contact with the glow discharge, among the surface of members constituting the interior of the reaction vessel other than the control of the surface of the high frequency power-introducing means. Examples of the member include the internal wall of the reaction vessel 100 shown in FIG. 1, the raw material gas-introducing means 105, the dummy member 113 covering the ends of the substrate 101, the rotary shaft 108 and any other part on which a deposited film is attached during formation of a deposited film. The portion on which a deposited film can be attached is preferably a specified portion in consideration of the portion being a flat portion, a portion having an electrode function, a portion of a high temperature or a portion of a large area.

Also according to the present invention, a deposition preventing plate may be provided on the surface of the above-mentioned member in contact with the glow discharge. In such case, the effect of the present invention can be obtained by controlling in the above-described range the surface roughness of at least a portion of the deposition preventing plate in contact with the glow discharge. In the case of providing the deposition preventing plate, it is possible to obtain the effect of facilitating the cleaning of the interior of the reaction vessel by replacing a deposition prevention plate attached with a deposited film by a deposition prevention plate without a deposited film as well as the effect of easily forming the surface roughness. Particularly, it is possible to prevent the film peeling by providing the deposition preventing plate in the vicinity of the inside wall of the reaction vessel or in a vicinity being in such an extent of covering the high frequency power-introducing means.

The material of the members to be worked in the above ranges of Rz and S is not limited, so far as the above surface roughness can be achieved. For example, in the case of the high frequency power introducing means requiring conductivity or the internal wall of the reaction vessel requiring the shielding property, a metallic material can be selected.

Examples of such metallic material include Al, Cr, Mo, Au, In, Ni, Ti, Pt, Fe, and an alloy thereof. In addition there may also be employed an insulating material having a conductive layer formed on a surface thereof. In such case, there may be adopted a method of coating with a powdered material that can directly form a rough surface such as the plasma spraying method, or a chemical plating method. The plating method can be adopted under a condition that will not degrade the surface roughness. Further, a blast method of blowing a powdered material such as of glass is preferable because of obtaining a high abrasion resistant surface.

For the member which does not functionally require the conductivity, such as the deposition preventing plate, the raw material gas introducing means or the dummy member, there may be employed an insulating material in addition to the metallic material mentioned above. Examples of the insulating material include resin materials such as teflon or polycarbonate, glass materials such as quartz glass or pyrex glass, ceramic materials such as alumina, zirconia, mullite, cordierite, silicon carbide, boron nitride or aluminum nitride, and a mixture thereof. Also depending upon the constitution of the reaction vessel, the member requiring conductivity or insulating property, for example, the rotary shaft may be composed of the above-mentioned metallic or insulating material if necessary.

Among the insulating materials mentioned above, the ceramic materials as a dielectric material exhibit strong adhesion to the deposited film and are therefore preferably used for the member for preventing generation of the spherical projections. Among these ceramic materials, alumina, boron nitride and aluminum nitride are superior in the electrical properties such as dielectric tangent and insulation resistance and exhibit little absorption for the high frequency power and therefore are suitable for the material of the member constituting the interior of the reaction vessel, particularly for the material of the deposition preventing plate. The above ceramic material such as alumina, boron nitride and aluminum nitride are used as the most suitable material for the window for transmitting the microwave or the insulator of the high frequency power-introducing means.

For the metallic or insulating materials mentioned above, the rough surface may be formed by any method as long as Rz within a range of 5 $\mu$m to 200 $\mu$m and S within a range of 5 $\mu$m to 100 $\mu$m are obtained. For example, there may be employed the blasting method of blasting the above-mentioned powdered material such as glass, i.e., a material to be blasted under a high pressure, the plasma spraying method for coating with fine particles under a high pressure and a high temperature, or the etching method. Among them, the blasting method and the plasma spraying method are particularly preferred because the value S can be relatively easily made smaller when the value Rz is made large. The plasma spraying method can also be utilized for spraying a ceramic material on the metallic material mentioned above.

The substrate employed in the present invention may be conductive or electrically insulating. The conductive substrate may be composed of a metal such as Al, Cr, Mo, Au, In, Nb, Te, V, Ti, Pt, Pd, Fe or phosphor bronze, or an alloy thereof such as stainless steel. The conductive substrate may also be composed of a film or a sheet of a synthetic resin such as polyester, polyethylene, polycarbonate, cellulose acetate, polypropylene, polyvinyl chloride, polystyrene or polyamide, or glass, or ceramics, at least a light-receiving layer forming surface side which is subjected to a conductive treatment. Such substrate can be heated to a desired temperature within a range of 20° C. to 500° C. during film deposition.

In the case of forming a deposited film of amorphous silicon (a-Si:H) on the substrate surface in the present invention, there may be employed, as the raw material gas, gaseous silane compounds or gasifiable silicon oxides (for example, silanes) such as $SiH_4$, $Si_2H_6$, $Si_3H_8$ or $Si_4H_{10}$. Among them, $SiH_4$ and $Si_2H_4$ are preferable in consideration of ease handling in film formation and the Si supplying efficiency. If necessary, in addition to these gasses, there may be employed a gas containing atoms capable of controlling the conductivity. Such conductivity controlling atoms can be so-called impurity in the semiconductor technology, such as the atoms belonging to the group IIIb of the Periodic Table for providing the p-type conductivity (hereinafter referred to as "group IIIb atoms") or the atoms belonging to the group V of the Periodic Table for providing the n-type conductivity (hereinafter referred to as "group V atoms").

Examples of the raw material for introducing the group IIIb atoms include, for introducing boron atoms, boron hydrides such as $B_2H_6$, $B_4H_{10}$, $B_5H_9$, $B_5H_{11}$, $B_6H_{10}$, $B_6H_{12}$ or $B_6H_{14}$, and boron halides such as $BF_3$, $BCl_3$ or $BBr_3$. In addition there may also be employed, for example, $AlCl_3$, $GaCl_3$, $Ga(CH_3)_3$, $InCl_3$ or $TlCl_3$.

Examples of the raw material for introducing the group Vb atoms include, for introducing phosphor atoms, phosphor hydrides such as $PH_3$ or $P_2H_4$, and phosphor halides such as $PH_4I$, $PF_3$, $PF_5$, $PCl_3$, $PCl_5$, $PBr_3$, $PBr_5$ or $PI_3$. Examples of other effective raw material for introducing the group Vb atoms include $AsH_3$, $AsF_3$, $AsCl_3$, $AsBr_3$, $AsF_3$, $SbH_3$, $SbF_3$, $SbF_5$, $SbCl_3$, $SbCl_5$, $BiH_3$, $BiCl_3$ and $BiBr_3$. Such raw material for introducing the conductivity-controlling atoms may be diluted with $H_2$ and/or He if necessary.

In the case of forming a layer of amorphous silicon carbide (a-SiC), there may be employed a gaseous or gasifiable material such as $CH_4$, $C_2H_6$, $C_3H_8$ or $C_4H_{10}$ in addition to the above-mentioned raw material gas. For example, in the case of forming amorphous silicon oxide (a-SiO), as the gas for introducing oxygen atoms, in addition to the aforementioned raw material gas, there may be employed oxygen ($O_2$), ozone ($O_3$), nitrogen monoxide (NO), nitrogen dioxide ($NO_2$), dinitrogen oxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), or a compound consisting of silicon (Si), oxygen (O) and hydrogen (H) atoms, for example, lower siloxanes such as disiloxane ($H_3SiOSiH_3$) or trisiloxane ($H_3SiOSiH_2OSiH_3$). Also in the case of forming amorphous silicon nitride (a-SiN) in the present invention, as the gas for introducing nitrogen atoms, in addition to the aforementioned raw material gas, there may be employed a gaseous or gasifiable nitrogen compound including nitrogen, nitrides and azides such as nitrogen ($N_2$), ammonia ($NH_3$), hydrazine ($H_2NNH_2$), hydrogen azide ($HN_3$).

The high frequency power to be employed in the present invention may have any frequency, for example, in the RF region such as 13.56 MHz, in the microwave region such as 2.45 GHz or in the VHF region such as 105 MHz. The high frequency power may be determined according to the purpose, but in the usual case it is preferably within a range of 10 to 5000 W for each substrate. The pressure in the reaction vessel may be similarly determined according to the purpose, but in the usual case it is preferably within a range of 0.01 to 1000 Pa.

The substrate temperature, the kind and flow rate of the used gas, the high frequency power and the pressure in the reaction vessel are not separately and uniformly determined but are optically selected according to the characteristics of a desired deposited film.

In the following the present invention will be described in details with reference to examples thereof, but the present invention is not limited by such examples.

EXAMPLE 1

The deposited film-forming apparatus shown in FIGS. 1A and 1B was employed to produce the electrophotographic photosensitive member as shown in FIG. 2, under the conditions shown in Table 1. This example employed the high frequency power-introducing means having a surface processed with the blasting method so as to obtain a substantially constant Rz value but a varying S value. The Rz and S values are shown in Table 2. Each of Rz and S values in Table 2 was obtained by measuring the surface of each high frequency power-introducing means at arbitrary 10 points and averaging the measured results.

TABLE 2

| Sample No. | S ($\mu$m) | Rz ($\mu$m) |
| --- | --- | --- |
| 1 | 2.8 | 25.3 |
| 2 | 5.0 | 24.4 |
| 3 | 10.6 | 26.5 |
| 4 | 50.0 | 26.4 |
| 5 | 80.9 | 23.9 |
| 6 | 96.8 | 24.6 |
| 7 | 106.9 | 25.9 |
| 8 | 130.7 | 24.1 |

Figure 6:
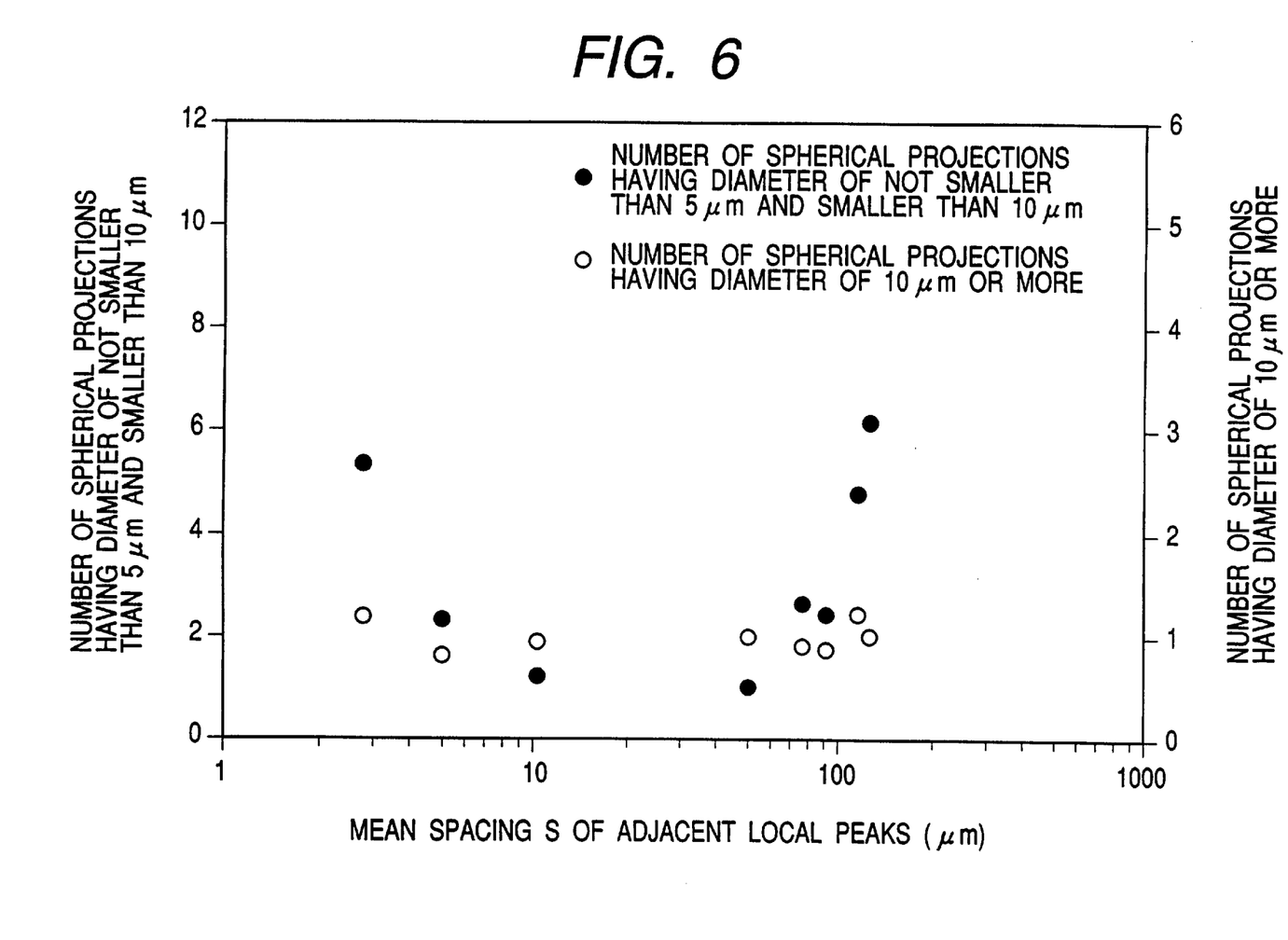
FIG. 6 is a graph showing the number of spherical projections in Example 1.

The surface of each of eight electrophotographic photosensitive members thus produced was observed for an area of 10 cm$^2$ under a microscope, and the number of the spherical projections having a diameter of not smaller than 5 $\mu$m and smaller than 10 $\mu$m and the number of the spherical projections having a diameter of 10 $\mu$m or more were counted and averaged. The obtained results are shown in FIG. 6, in which the number of the spherical projections having a diameter of not smaller than 5 $\mu$m and smaller than 10 $\mu$m and the number of the spherical projections having a diameter of 10 $\mu$m or more are shown in relative values by taking the number of the spherical projections of Sample No. 4 (S=46.3 $\mu$m, Rz=26.4 $\mu$m) as 1. These values were 0.28 times for the spherical projections of 5 $\mu$m$\leq$diameter<10 $\mu$m and 1.38 times for the spherical projections of diameter $\geq$10 $\mu$m, in comparison with the values in the foregoing Experiment 1. The results shown in FIG. 6 indicate that the number of the spherical projections of 5 $\mu$m$\leq$diameter<10 $\mu$m increases rapidly in the case of S smaller than about 5 $\mu$m. This is presumably because in the case of the value of S smaller than 5 $\mu$m, small peaks on the roughness curve do not have enough height for preventing the film peeling. The number of the spherical projections of 5 $\mu$m$\leq$diameter<10 $\mu$m does not show a large change within a range of S from 5.0 to 50.0 $\mu$m, but the number gradually increases when S becomes larger than 50.0 $\mu$m and rapidly increases when S becomes larger than about 100 $\mu$m. On the other hand, the spherical projections having a diameter of 10 $\mu$m or more does not have a relationship with the value S.

EXAMPLE 2

The deposited film-forming apparatus shown in FIGS. 1A and 1B was employed to produce an electrophotographic photosensitive member as shown in FIG. 2, under the conditions shown in Table 1. This example employed the high frequency power-introducing means having a surface processed with the blasting method so as to obtain a substantially constant S value but a varying Rz value. The Rz and S values are shown in Table 3. Each of Rz and S values in Table 3 was obtained by measuring the surface of the high frequency power-introducing means at arbitrary 10 points and averaging the measured results.

TABLE 3

| Sample No. | S ($\mu$m) | Rz ($\mu$m) |
| --- | --- | --- |
| 9 | 43.5 | 1.9 |
| 10 | 45.8 | 3.8 |
| 11 | 42.7 | 5.0 |
| 12 | 49.1 | 15.7 |
| 13 | 43.4 | 50.5 |
| 14 | 42.6 | 98.6 |
| 15 | 48.5 | 200 |
| 16 | 41.7 | 206.5 |

Figure 7:
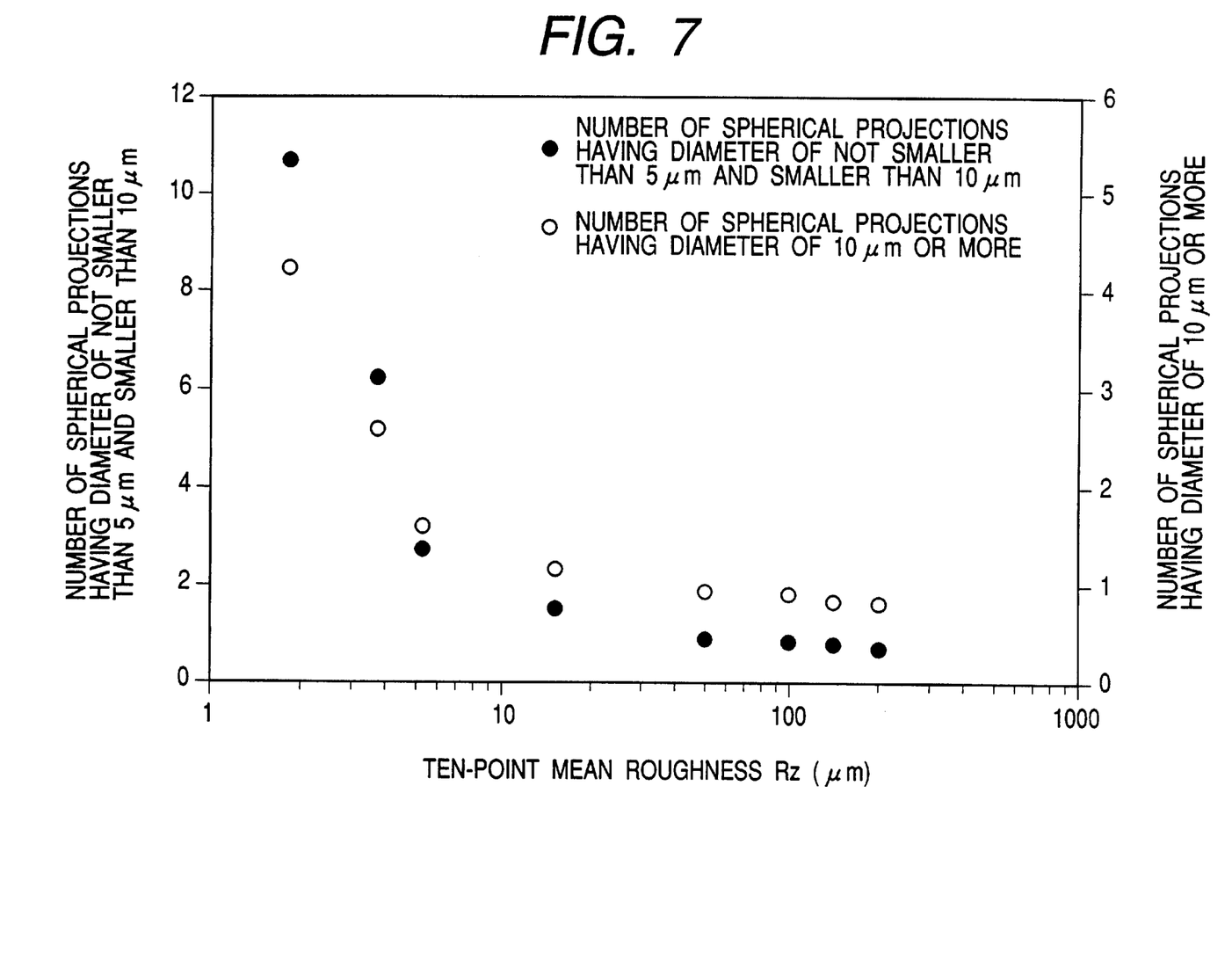
FIG. 7 is a graph showing the number of spherical projections in Example 2.

The obtained results are shown in FIG. 7, in which the number of the spherical projections of 5 $\mu$m$\leq$diameter<10 $\mu$m and the number of the spherical projections of diameter $\geq$10 $\mu$m are shown in relative values by taking the number of the spherical projections of Sample No. 4 (S=46.3 $\mu$m, Rz=26.4 $\mu$m) of Example 1 as 1. The results shown in FIG. 7 indicate that the number of the spherical projections of 5 $\mu$m$\leq$diameter<10 $\mu$m and the number of the spherical projections of diameter $\geq$10 $\mu$m increase rapidly in the case of Rz smaller than about 5 $\mu$m even when S is within a satisfactory range. This is presumably because in the case of the value of Rz smaller than 5 $\mu$m there cannot be suppressed the film peeling which increases the number of the spherical projections of diameter $\geq$10 $\mu$m, thereby also increasing the number of the spherical projections of 5 $\mu$m$\leq$diameter<10 $\mu$m. The number of the spherical projections of 5 $\mu$m$\leq$diameter<10 $\mu$m and the number of the spherical projections of diameter $\geq$10 $\mu$m tend to decrease with the increase of Rz.

The above-explained results of Examples 1 and 2 indicate that the spherical projections having a diameter of 10 $\mu$m or more mainly depend on the value of Rz and increase when the value of Rz is not in the satisfactory range of not smaller than 5 $\mu$m and not larger than 200 $\mu$m even if S remains in the satisfactory range. On the other hand, the small film peeling which gives rise to the formation of the spherical projections of 5 $\mu$m$\leq$diameter<10 $\mu$m is considered to mainly depend on the value of S. But in a situation where the number of the spherical projections of diameter $\geq$10 $\mu$m increases, the number of the spherical projections of 5 $\mu$m$\leq$diameter<10 $\mu$m also increases because of the influence of such situation. Therefore, it is important in the present invention to simultaneously satisfy two conditions that Rz is within a range of 5 to 200 $\mu$m and that S is within a range of 5 to 100 $\mu$m in order to prevent the formation of the spherical projections.

EXAMPLE 3

In the deposited film-forming apparatus shown in FIGS. 1A and 1B, the high frequency power-introducing means was covered with each of seven materials of aluminum (A5052), stainless steel (SUS304), alumina, boron nitride, aluminum nitride, mullite and silicon carbide. In the case of covering the high frequency power-introducing means with aluminum or stainless steel, the same material as the material for covering the means was used as the material for forming the means. The surface of the high frequency power-introducing means was coated with aluminum or stainless steel by plasma spraying method to prepare two samples. In the case of covering the high frequency power-introducing means with alumina, boron nitride, aluminum nitride, mullite and silicon carbide, each of these materials was molded in a cylindrical shape as a deposition preventing plate. The cylindrical deposition preventing member was arranged so as to surround the high frequency power-introducing means, thereby obtaining five samples. Additionally, the surface of a portion of the deposition preventing member in contact with discharge was subjected to a roughness treatment by a blasting method. A substrate installed within the reaction vessel was treated under the conditions shown in Table 4 to produce electrophotographic photosensitive members.

TABLE 4

| Layer structure | Charge injection inhibiting layer | Photo-conductive layer | Surface layer |
|---|---|---|---|
| Raw material gas and flow rate: | | | |
| $SiH_4$ (sccm) | 120 | 120 | 80 |
| $H_2$ (sccm) | 600 | | |
| $B_2H_6$ (ppm) (with respect to $SiH_4$) | 1000 | 0.5 | |
| $CH_4$ (sccm) | | | 250 |
| Substrate temp. (° C.) | 280 | 260 | 220 |
| Internal pressure (Pa) | 3 | 3 | 6 |
| High frequency power (W) (105 MHz) | 500 | 600 | 600 |
| Layer thickness (μm) | 3 | 28 | 0.5 |

In FIG. 4, the layer thickness is given in an approximate value.

The surface roughness of the deposition preventing plates employed in the present example is shown in Table 5.

TABLE 5

| Sample No. | Material | S (μm) | Rz (μm) |
|---|---|---|---|
| 17 | aluminum (A5052) | 48.8 | 28.5 |
| 18 | stainless (SUS304) | 44.9 | 25.7 |
| 19 | alumina | 46.2 | 26.8 |
| 20 | boron nitride | 45.6 | 23.5 |
| 21 | aluminum nitride | 44.1 | 28.9 |
| 22 | mullite | 48.8 | 29.0 |
| 23 | silicon carbide | 49.8 | 24.8 |

Rz and S were measured on 10 points arbitrarily selected on each surface of the samples and was averaged in the same manner as in Example 1 to obtain each value of Rz and S in Table 5. The number of the spherical projections of 5 μm≦diameter<10 μm and of the spherical projections of diameter ≧10 μm were evaluated on thus produced seven electrophotographic photosensitive members, similarly to Example 1. The obtained results are shown in Table 6. In Table 6, the number of the spherical projections of 5 μm≦diameter<10 μm and the number of the spherical projections of diameter ≧10 μm were shown in relative values by taking the value of Sample No. 4 steel SUS304, S=46.3 μm, Rz=26.4 μm) used in Example 1.

TABLE 6

| Sample No. | Material | Number of spherical projections (5 μm ≦ diameter < 10 μm) | Number of spherical projections (diameter ≧ 10 μm) |
|---|---|---|---|
| 17 | aluminum (A5052) | 0.96 | 0.97 |
| 18 | stainless (SUS304) | 0.98 | 1.05 |
| 19 | alumina | 0.55 | 0.52 |
| 20 | boron nitride | 0.51 | 0.49 |
| 21 | aluminum nitride | 0.58 | 0.52 |
| 22 | mullite | 0.76 | 0.84 |
| 23 | silicon carbide | 0.79 | 0.81 |

The results shown in Table 6 indicate that the surface of the high frequency power-supplying means composed of any material can provide the effect of the present invention of preventing the generation of the spherical projections. Among these, the ceramic material is more effective for suppressing the spherical projections. In particular, the highest effect can be obtained by using alumina, boron nitride or aluminum nitride. This is presumably because alumina, boron nitride or aluminum nitride is particularly superior in the electrical properties among the ceramic materials. Specifically, this is because that these materials having a low absorption of the high frequency power exhibit no significant temperature rise or that these materials exhibit a lower stress in the deposited film in comparison with other ceramic materials.

EXAMPLE 4

In the deposited film-forming apparatus shown in FIGS. 1A and 1B, the high frequency power-introducing means was provided with six kinds of deposition preventing plates, and the electrophotographic photosensitive members were produced under the conditions shown in Table 4. The deposition preventing plate was composed of alumina, boron nitride or aluminum nitride and the plates composed of the same material were differentiated in Rz and S to prepare two kinds of samples. Further, the plates were subjected to blasting for forming a rough surface. Other conditions were the same as those in Example 1. The surface roughness of the deposition preventing plates employed in the present example is shown in Table 7.

TABLE 7

| Sample No. | Material | S (μm) | Rz (μm) |
|---|---|---|---|
| 24 | alumina | 3.8 | 54.3 |
| 25 | alumina | 123.6 | 51.0 |
| 26 | boron nitride | 3.1 | 59.3 |
| 27 | boron nitride | 119.5 | 52.3 |
| 28 | aluminum nitride | 3.4 | 54.8 |
| 29 | aluminum nitride | 120.5 | 56.2 |

Each value of Rz and S in Table 7 was obtained by measuring Rz and S on 10 points arbitrarily selected on each surface of the samples and averaging in the same manner as in Example 1. The number of the spherical projections of 5 μm≦diameter<10 μm and the number of the spherical projections of diameter ≧10 μm were evaluated on thus produced six electrophotographic photosensitive members, similarly to Example 1. The obtained results are shown in Table 8. In Table 8, the number of the spherical projections of 5 µm≦diameter<10 µm and the number of the spherical projections of diameter ≧10 µm were shown in relative values by taking the value of Sample No. 4 (stainless steel SUS304, S=46.3 µm, Rz=26.4 µm) used in Example 1.

TABLE 8

| Sample No. | Material | Number of spherical projections (5 µm ≦ diameter < 10 µm) | Number of spherical projection (diameter ≧ 10 µm) |
| --- | --- | --- | --- |
| 24 | alumina | 3.8 | 0.48 |
| 25 | alumina | 5.8 | 0.46 |
| 26 | boron nitride | 3.1 | 0.50 |
| 27 | boron nitride | 5.1 | 0.48 |
| 28 | aluminum nitride | 3.5 | 0.48 |
| 29 | aluminum nitride | 5.3 | 0.46 |

The results shown in Table 8 indicate that the number of the spherical projections of 5 µm≦diameter<10 µm increases regardless of the material, in the case of the value S of smaller than 5 µm and larger 100 µm.

EXAMPLE 5

In the deposited film-forming apparatus shown in FIGS. 1A and 1B, the high frequency power-introducing means was provided with a deposition preventing plate prepared with aluminum (A5052) or alumina and subjected to blasting for forming a rough surface, and the electrophotographic photosensitive members were produced under the conditions shown in Table 9. In the present example, 60 MHz was used as the high frequency power and was lower than that of other examples.

TABLE 9

| Layer structure | Charge injection inhibiting layer | Photo-conductive layer | Surface layer |
| --- | --- | --- | --- |
| Raw material gas and flow rate: | | | |
| SiH$_4$ (sccm) | 150 | 150 | 20 |
| B$_2$H$_6$ (ppm) (with respect to SiH$_4$) | 1000 | 0.3 | |
| CH$_4$ (sccm) | | | 250 |
| Substrate temp. (° C.) | 280 | 300 | 300 |
| Internal pressure (Pa) | 10 | 10 | 10 |
| High frequency power (W) (60 MHz) | 600 | 1000 | 300 |
| Layer thickness (µm) | 3 | 35 | 0.5 |

The layer thickness in Table 9 is given in an approximate value.

The surface roughness of the deposition preventing plate employed in the present example is shown in Table 10.

TABLE 10

| Sample No. | Material | S (µm) | Rz (µm) |
| --- | --- | --- | --- |
| 30 | aluminum (A5052) | 93.2 | 138.7 |
| 31 | alumina | 96.8 | 140.5 |

The values of Rz and S in Table 10 were obtained by measuring Rz and S on 10 points arbitrarily selected on each surface of the samples and averaging in the same manner as in Example 1.

Also as a comparative example, the high frequency power-introducing means was provided with a deposition preventing plate having a surface of the value S outside the range of the present invention.

In the deposited film-forming apparatus shown in FIGS. 1A and 1B, the high frequency power-introducing means was provided with a deposition preventing plate prepared with aluminum (A5052) or alumina and subjected to blasting for forming a rough surface, and the electrophotographic photosensitive members were produced as comparative examples, under the conditions shown in Table 9. The surface roughness of the deposition preventing plate employed in the present comparative example is shown in Table 11.

TABLE 11

| Sample No. | Material | S (µm) | Rz (µm) |
| --- | --- | --- | --- |
| 32 | aluminum (A5052) | 111.9 | 138.7 |
| 33 | alumina | 107.7 | 140.5 |
| 34 | aluminum (A5052) | 3.6 | 136.6 |
| 35 | alumina | 4.1 | 132.8 |

The values of Rz and S in Table 11 were obtained by measuring Rz and S on 10 points arbitrarily selected on each surface of the samples and averaging in the same manner as in Example 1.

Then, six electrophotographic photosensitive members produced with Sample Nos. 30 to 35 were subjected to the evaluation of the number of the spherical projections of 5 µm≦diameter<10 µm and the number of the spherical projection of diameter ≧10 µm. Also the presence or absence of white spots and black spots was evaluated in the following manner, on each photosensitive member.

Evaluation with an overall black image (evaluation for white spots)

Each electrophotographic photosensitive member was mounted on an electrophotographic apparatus (Canon NP6085 modified for experimental use), and an overall black image (full black image) was prepared by eliminating the imagewise exposure. Thus obtained overall black image was visually inspected for any white spots.

The evaluation with the overall black image is classified in the following four categories.

⊚: extremely satisfactory (no white spot observed)

○: satisfactory (several white spots observed)

Δ: acceptable in practical use (white spots observed but not hindering image reading)

x: not acceptable in practical use because of image defects extremely observed

Evaluation with an overall white image (evaluation for black spots)

Each electrophotographic photosensitive member was mounted on an electrophotographic apparatus (Canon NP6085 modified for experimental use), and an overall white image (full white image) was prepared by placing a white paper on the original table. Thus obtained overall white image was visually inspected for any black spots.

The evaluation with the overall white image is classified in the following four categories.

⊚: extremely satisfactory (no black spot observed)

○: satisfactory (several black spots observed)

Δ: acceptable in practical use (black spots observed but not hindering image reading)

x: not acceptable in practical use because of image defects extremely observed

Table 12 summarizes the evaluation of the white and black spots, the number of the spherical projections of 5 μm≦diameter<10 μm and the number of the spherical projections of diameter ≧10 μm in Samples Nos. 30 to 35 shown in Tables 10 and 11.

TABLE 12

| | Sample No. | Number of spherical projections (5 μm ≦ diameter < 10 μm) | Number of spherical projections (diameter ≧ 10 μm) | White spots | Black spots |
|---|---|---|---|---|---|
| Example | 30 | 2.21 | 0.88 | ⊚ | ⊚ |
| 5 | 31 | 1.08 | 0.57 | ⊚ | ⊚ |
| Comparative | 32 | 4.84 | 0.91 | ○ | ○ |
| Example | 33 | 4.38 | 0.51 | ○ | ○ |
| | 34 | 4.28 | 0.86 | ○ | ○ |
| | 35 | 3.21 | 0.49 | ⊚ | ○ |

In Table 12, the number of the spherical projections of 5 μm≦diameter<10 μm and the number of the spherical projections of diameter ≧10 μm are given in relative values by taking the values of Sample No. 4 (stainless steel SUS304, S=46.3 μm, Rz=26.4 μm) used in Example 1.

The results shown in Table 12 indicate that the number of the spherical projections is reduced by using the deposition preventing plate prepared according to the present invention. On the other hand, Samples of Nos. 32 to 35 prepared for comparison with the present invention showed increase in the number of the spherical projections of 5 μm≦diameter<10 μm, and also the copied images showed in particular a large number of black spots.

As explained in the foregoing, according to the present invention, it is possible to effectively prevent the film peeling in a deposited film-forming apparatus by controlling, among members constituting the deposited film-forming apparatus, the surface of a member in contact with discharge to have the ten-point mean roughness Rz of not smaller than 5 μm and not larger than 200 μm and the mean spacing S of adjacent local peaks of not smaller than 5 μm and not larger than 100 μm. The present invention can therefore provide a deposited film-forming apparatus and a deposited film-forming method capable of preventing abnormal growth of the deposited film. In particular, in the case of producing electrophotographic photosensitive members, it is rendered possible to effectively suppress the white and black spots on a copy image and there can be provided a method capable of forming an amorphous silicon-based electrophotographic photosensitive member excellent in quality.

What is claimed is:

1. A vacuum processing apparatus comprising: a reaction vessel, an electric power-introducing means for generating discharge in the reaction vessel, and a gas introducing means for supplying a gas into the vessel, wherein a surface of a member confronted with a discharge space has (1) a ten-point mean roughness Rz of not smaller than 5 μm and not larger than 200 μm, and (2) a mean spacing S of adjacent local peaks of not smaller than 5 μm and not larger than 100 μm.

2. The vacuum processing apparatus according to claim 1, wherein the member is the electric power-introducing means.

3. The vacuum processing apparatus according to claim 1, wherein the member is the vessel.

4. The vacuum processing apparatus according to claim 1, wherein the member is the gas introducing means.

5. The vacuum processing apparatus according to claim 1, wherein the member is a dummy member for covering an end of a substrate within the vessel.

6. The vacuum processing apparatus according to claim 1, wherein the member is a rotary shaft for rotating a substrate within the vessel.

7. The vacuum processing apparatus according to claim 1, wherein the member is a deposition preventing plate.

8. The vacuum processing apparatus according to claim 7, wherein the deposition preventing plate has a cylindrical shape.

9. The vacuum processing apparatus according to claim 7, wherein the deposition preventing plate is arranged between the electric power-introducing means and the vessel.

10. The vacuum processing apparatus according to claim 7, wherein the deposition preventing plate is arranged so as to cover the electric power-introducing means.

11. The vacuum processing apparatus according to claim 1, wherein the surface of the member is composed of a ceramic material.

12. The vacuum processing apparatus according to claim 11, wherein the ceramic material is at least one selected from the group consisting of aluminum oxide, boron nitride and aluminum nitride.

13. The vacuum processing apparatus according to claim 1, wherein the vacuum processing apparatus is a deposited film-forming apparatus for forming a deposited film on a substrate housed within the vessel.

14. The vacuum processing apparatus according to claim 13, wherein the vacuum processing apparatus is a deposited film-forming apparatus for producing an electrophotographic photosensitive member.

15. A vacuum processing method comprising the steps of:
supplying a gas into a discharge space;
supplying an electric power into an electric power-introducing means; and
generating discharge in the discharge space confronted with a surface of a member having (1) a ten point mean roughness Rz of not smaller than 5 μm and not larger than 200 μm, and (2) a mean spacing S of adjacent local peaks of not smaller than 5 μm and not larger than 100 μm.

16. The vacuum processing method according to claim 15, wherein the member is the electric power-introducing means.

17. The vacuum processing method according to claim 15, wherein the member is a vessel confronted with the discharge space.

18. The vacuum processing method according to claim 15, wherein the member is the gas introducing means.

19. The vacuum processing method according to claim 15, wherein the member is a dummy member for covering an end of a substrate within a vessel surrounding the discharge space.

20. The vacuum processing method according to claim 15, wherein the member is a rotary shaft for rotating a substrate within a vessel surrounding a discharge space.

21. The vacuum processing method according to claim 15, wherein the member is a deposition preventing plate.

22. The vacuum processing method according to claim 21, wherein the deposition preventing plate has a cylindrical shape.

23. The vacuum processing method according to claim 21, wherein the deposition preventing plate is arranged between the electric power-introducing means and a vessel surrounding the discharge space.

24. The vacuum processing method according to claim 21, wherein the deposition preventing plate is arranged so as to cover the electric power-introducing means.

25. The vacuum processing method according to claim 15, wherein the surface of the member is composed of a ceramic material.

26. The vacuum processing method according to claim 25, wherein the ceramic material is at least one selected from the group consisting of aluminum oxide, boron nitride and aluminum nitride.

27. The vacuum processing method according to claim 15, wherein the vacuum processing method is a deposited film-forming method comprising a step of housing a substrate within a vessel surrounding the discharge space.

* * * * *

UNITED STATES PATENT AND TRADEMARK OFFICE
CERTIFICATE OF CORRECTION

PATENT NO. : 6,250,251 B1
DATED : May 29, 2001
INVENTOR(S) : Kazuyoshi Akiyama et al.

It is certified that error appears in the above-identified patent and that said Letters Patent is hereby corrected as shown below:

Title page,
Item [56], References Cited, FOREIGN PATENT DOCUMENTS,
"60-186849     9/1995" should read -- 60-186849     9/1985 --.

Column 2,
Line 2, "devices." should read -- devices is involved. --.

Column 3,
Line 7, "deposited" should read -- deposited film --.

Column 6,
Line 53, "$\mu$m<diameter<10" should read -- $\mu$m<diameter<10 --.

Column 7,
Line 41, "is" should be deleted.

Column 9,
Line 9, "of" should be deleted.

Column 10,
Line 6, "ease" should read -- easy --.

Column 13,
Line 55, "was" should read -- were --;
Line 58, "and" should read -- and the number --; and
Line 66, "No. 4" should read -- No. 4 (stainless --.

UNITED STATES PATENT AND TRADEMARK OFFICE
CERTIFICATE OF CORRECTION

PATENT NO. : 6,250,251 B1
DATED : May 29, 2001
INVENTOR(S) : Kazuyoshi Akiyama et al.

It is certified that error appears in the above-identified patent and that said Letters Patent is hereby corrected as shown below:

Column 14,
Line 30, "that" should be deleted.

Signed and Sealed this

Twelfth Day of March, 2002

*Attest:*

JAMES E. ROGAN
*Director of the United States Patent and Trademark Office*

*Attesting Officer*